US007226825B2

(12) United States Patent
Anderson et al.

(10) Patent No.: US 7,226,825 B2
(45) Date of Patent: Jun. 5, 2007

(54) METHOD OF FABRICATING MICRO-CHIPS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 10/711,399

(22) Filed: Sep. 16, 2004

(65) Prior Publication Data

US 2006/0057791 A1  Mar. 16, 2006

(51) Int. Cl.
*H01L 21/336* (2006.01)
*H01L 21/8234* (2006.01)
*H01L 21/30* (2006.01)
*H01L 21/46* (2006.01)
*H01L 21/302* (2006.01)

(52) U.S. Cl. ............. 438/197; 438/489; 438/458; 438/689

(58) Field of Classification Search ............... 438/197, 438/164, 490, 489, 689, 458, 484
See application file for complete search history.

(56) References Cited

U.S. PATENT DOCUMENTS 6,331,444 B1 * 12/2001 Ferrari et al. ............. 438/52
6,764,936 B2 * 7/2004 Daneman et al. ......... 438/599

* cited by examiner

*Primary Examiner*—Chuong Anh Luu
(74) *Attorney, Agent, or Firm*—Schmeiser, Olsen & Watts; Anthony J. Canale

(57) ABSTRACT

A method of fabricating micro-chips, including: (a) providing a substrate; (b) forming a first single-crystal layer on a top surface of the substrate; (c) forming a second single-crystal layer on a top surface of the first single-crystal layer; (d) forming integrated circuits in the second single-crystal layer; (e) forming a set of intersecting trenches in the second-single crystal layer to form single-crystal islands, each single-crystal island containing one or more of the integrated circuits, the first single-crystal layer exposed in a bottom of the trench; and (f) removing the first single-crystal layer in order to separate the single-crystal islands from the substrate.

21 Claims, 8 Drawing Sheets

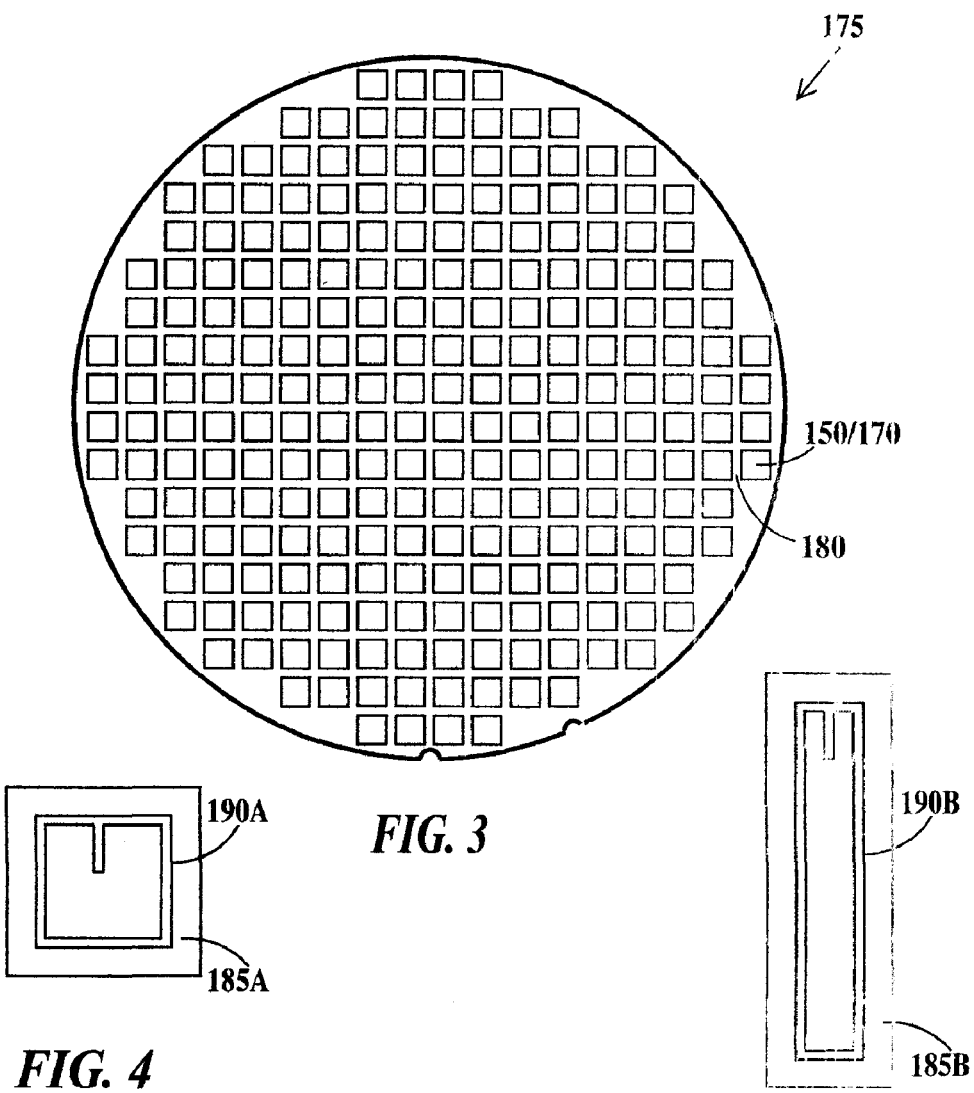
FIG. 3
FIG. 4
FIG. 5
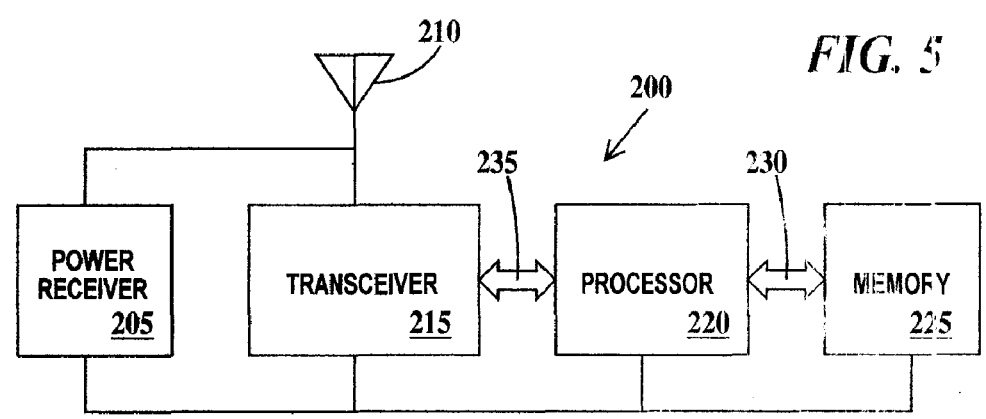
FIG. 6

METHOD OF FABRICATING MICRO-CHIPS

FIELD OF THE INVENTION

The present invention relates to the field of integrated circuit fabrication; more specifically, it relates to a method of fabricating integrated circuit micro-chips.

BACKGROUND OF THE INVENTION

There are two trends in integrated circuits. The first is to smaller device dimensions and denser circuit layouts which drive ever smaller integrated circuit chip footprints. The second, is to specialized integrated chips, that contain relatively few devices (for example, thousands instead of millions) and can be made with very small horizontal chip dimensions. In fact, some applications of these specialized chips require very small footprint integrated circuits.

One problem with fabricating small footprint integrated circuits is the large amounts of space required just to dice the wafer on which the integrated circuits are fabricated on into individual integrated circuit chips. A second problem, is the vertical to horizontal aspect ratio of very small integrated circuits can easily result in the vertical dimension (thickness) of the integrated circuit chip being significantly greater than the horizontal dimensions of the integrated circuit chip, even to the point of limiting the usefulness obtained by shrinking the horizontal dimensions.

Therefore, there is a need for a method of fabricating micro-chip integrated circuits that results in significantly reduced micro-chip thickness and reduced waste of wafer area.

SUMMARY OF THE INVENTION

A first aspect of the present invention is a method, comprising: (a) providing a substrate; (b) forming a first single-crystal layer on a top surface of the substrate; (c) forming a second single-crystal layer on a top surface of the first single-crystal layer; (d) forming integrated circuits in the second single-crystal layer; (e) forming a set of intersecting trenches in the second-single crystal layer to form single-crystal islands, each single-crystal island containing one or more of the integrated circuits, the first single-crystal layer exposed in a bottom of the trench; and (f) removing the first single-crystal layer in order to separate the single-crystal islands from the substrate.

A second aspect of the present invention is a structure, comprising: a substrate; a first single-crystal island on a top surface of the substrate; and a second single-crystal island on a top surface of the first single-crystal island, the second single-crystal island containing one or more devices or an integrated circuit.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 3 is a top view of a wafer illustrating an array of integrated circuits;

FIGS. 4 and 5 are a top views of two alternative footprints for an exemplary integrated circuit that may be fabricated according to the present invention;

FIG. 6 is a schematic circuit diagram of an exemplary integrated circuit that may be fabricated according to the present invention.

DETAILED DESCRIPTION OF THE INVENTION

Figure 1A:
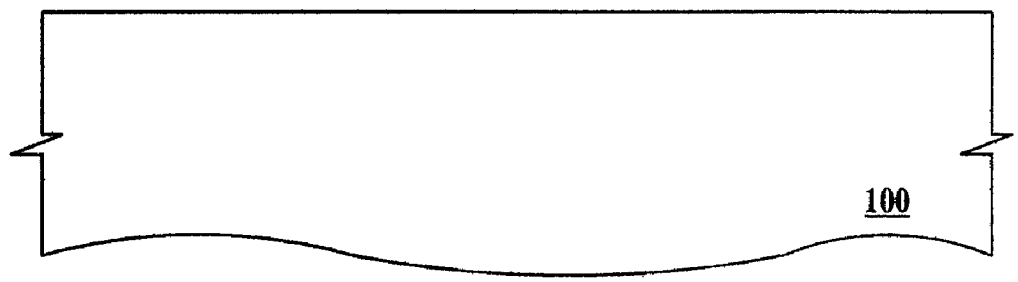
FIGS. 1A through 1I are partial cross sections illustrating fabrication of a micro-chip according to a first embodiment of the present invention.

FIGS. 1A through 1I are partial cross sections illustrating fabrication of a micro-chip according to a first embodiment of the present invention. In FIG. 1A, a single-crystal silicon substrate 100 is provided. In crystalline solids, the atoms, which make up the solid, are spatially arranged in a periodic fashion called a lattice. A crystal lattice always contains a volume, which is representative of the entire lattice and is regularly repeated throughout the crystal. In describing crystalline semiconductor materials, the following conventions are used. The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [−100], [0 −10] and [00 −1]. Planes in a crystal may also be identified with a set of three integers. They are used to define a set of parallel planes and each set of integers enclosed in ( ) parentheses identifies a specific plane. For example the proper designation for a plane perpendicular to the [100] direction is (100). Thus, if either a direction or a plane of a cubic lattice is known, its perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0−10) and (00−1). Layers having the sample crystal orientation will have same three three digit axis and plane designations.

Figure 1B:

In FIG. 1B, a single-crystal $Si_xGe_y$ (hereafter SiGe) layer 105 is formed on a top surface 105 of silicon substrate 100. SiGe layer 105 may be formed by epitaxial deposition using dichlorosilane ($SiCl_2H_2$), germane ($SiGe_4$) and $H_2$. It is to be understood that epitaxial deposition refers to the oriented growth of one crystalline substance upon the surface of another crystalline substance. In one example, SiGe layer 105 comprises about 20% to about 50% Ge atoms to total atoms and is between about 1 microns to about 100 microns thick. Note a $Si_xC_y$ layer may be grown instead of a $Si_xGe_y$ layer.

Figure 1C:
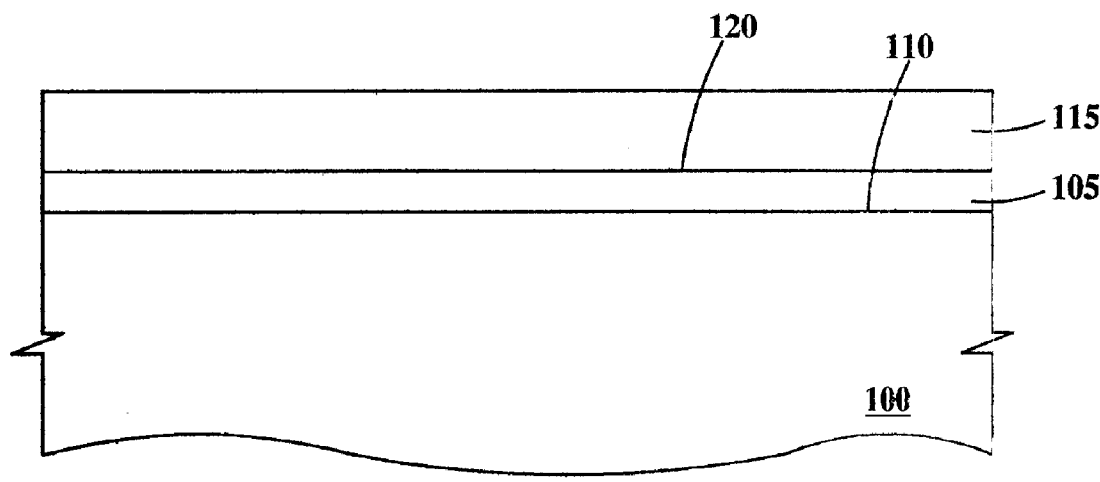

In FIG. 1C, a single-crystal silicon layer 115 is formed on a top surface 120 of SiGe layer 105. Silicon layer 115 may be formed by epitaxial deposition using silane (SiH$_4$) and H$_2$. Silicon layer 115 is a single-crystal grown in the same crystal orientation of single SiGe layer 105 upon which it is deposited. In one example, silicon layer 115 is between about 10 microns to about 100 microns thick.

Alternatively, the structure of FIG. 1C may be formed by ion implantation of Ge directly into substrate 100 followed by a heat treatment (annealing) so SiGe layer 105 is formed as a buried single-crystal layer so the process illustrated in FIG. 1B and described supra is eliminated. Silicon layer 115 is then a portion of substrate 100 above the buried SiGe layer 105. Further, instead of a Ge ion implantation, an As or C ion implantation may be performed, in which case the buried single-crystal layer becomes a Si$_x$As$_y$ layer or a Si$_x$C$_y$ layer.

Figure 1D:
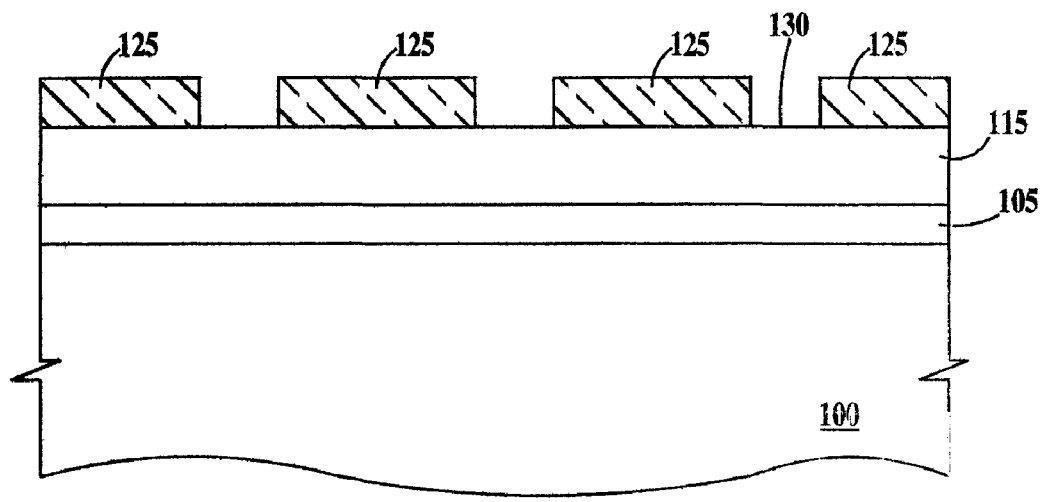

In FIG. 1D, devices (not shown) are fabricated in silicon layer 115 and interconnection islands 125 formed on a top surface 130 of silicon layer 115. The devices fabricated in silicon layer 115 may include, but is not limited to n-channel field effect transistors (NFETS), p-channel field effect transistors (PFETs), bipolar transistors, resistors and capacitors and other devices usually fabricated in semiconductor substrates as part of an integrated circuit. Interconnection islands 125 may include one or more dielectric layers containing electrically conductive wires usually used to interconnect the devices in silicon layer 115 into an integrated circuit.

Figure 1E:
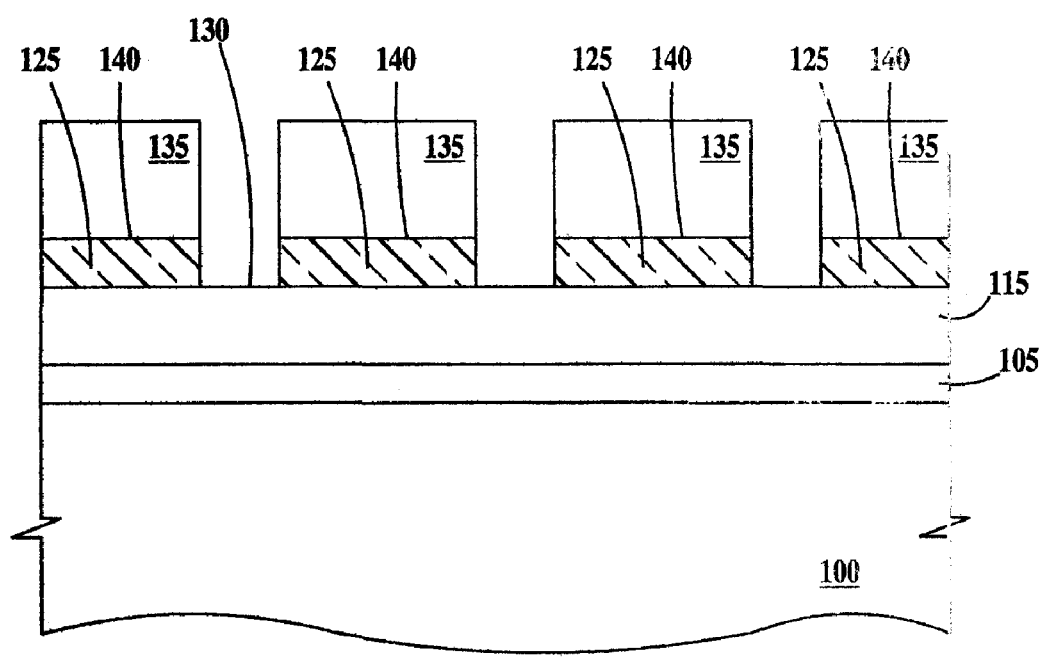

In FIG. 1E, photoresist islands 135 are formed on a top surface 140 of interconnection islands 125. Photoresist islands 135 may be formed by applying a layer of photoresist, exposing the photoresist through a mask, and then developing the photoresist layer to remove unwanted portions of the photoresist layer and exposing portions top surface 130 of silicon layer 115. Photoresist islands 135 will define the edges of individual integrated circuits as described infra.

Figure 1F:
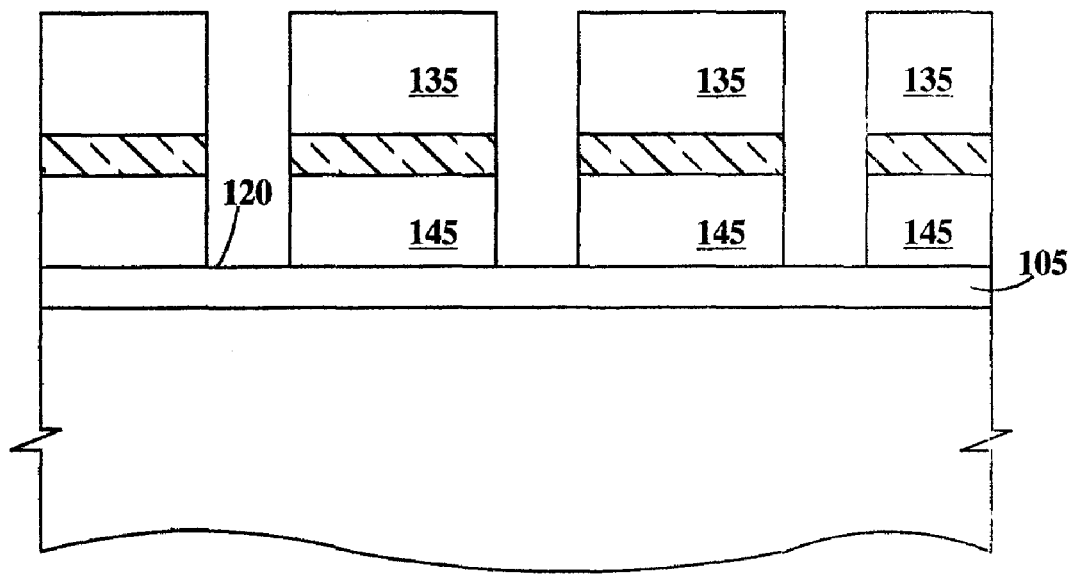

In FIG. 1F, silicon layer 115 (see FIG. 1E) has been removed wherever it was not protected by photoresist islands 135 to expose portions of top surface 120 of SiGe layer 105 and form silicon islands 145. Silicon layer 115 may be reactive ion etched (RIE) etched selectively with respect to SiGe layer 105. An RIE etch is a form of plasma etching that is often practiced to result in a higher etch rate in a direction perpendicular to the top surface of a substrate relative to a direction parallel to the top surface of the substrate. Alternatively, a non-selective timed over etch RIE performed or an RIE etch of silicon layer 115 may be performed until Ge is detected (i.e. by mass spectroscopy of down stream gases). Examples of a non-selective Si to SiGe RIE processes includes etching with an SF$_6$/O$_2$ mixture or etching with Br$_2$. An example of a selective Si to SiGe etching RIE process includes etching with a SF$_6$/H$_2$/CF$_4$ mixture. Silicon layer 115 may also be wet etched selectively to SiGe layer 105 using aqueous KOH or tetramethyl ammonium hydroxide (TMAH) when the Ge content of SiGe layer 105 exceeds about 20% Ge.

Figure 1G:
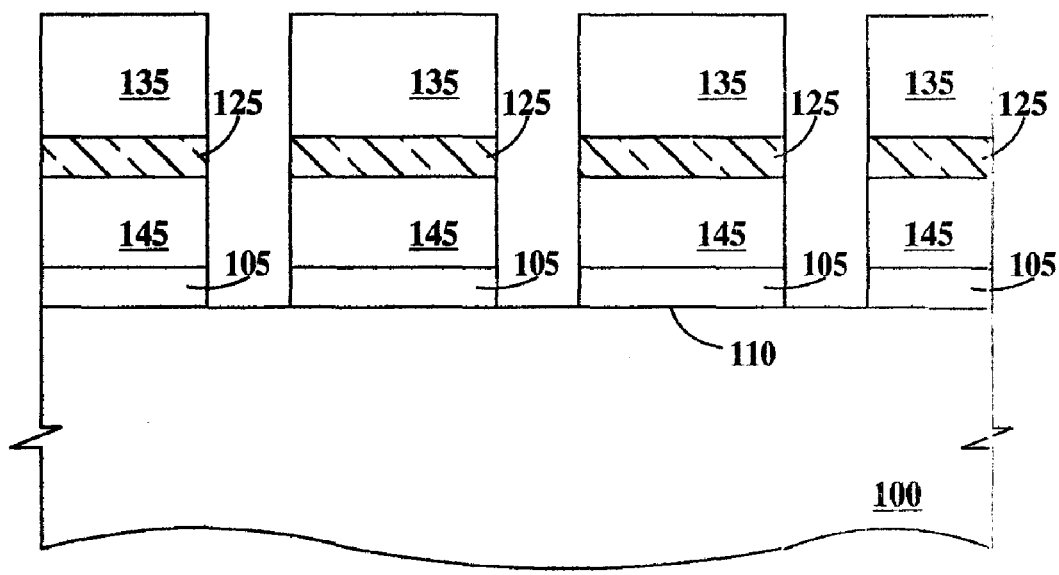

In FIG. 1G, SiGe layer 105 is removed wherever it was not protected by silicon islands 145. FIG. 1G may represent a separate SiGe etch step from the processes described supra in reference to FIG. 1F, or be a continuation of the etching of silicon layer 115.

Figure 1H:
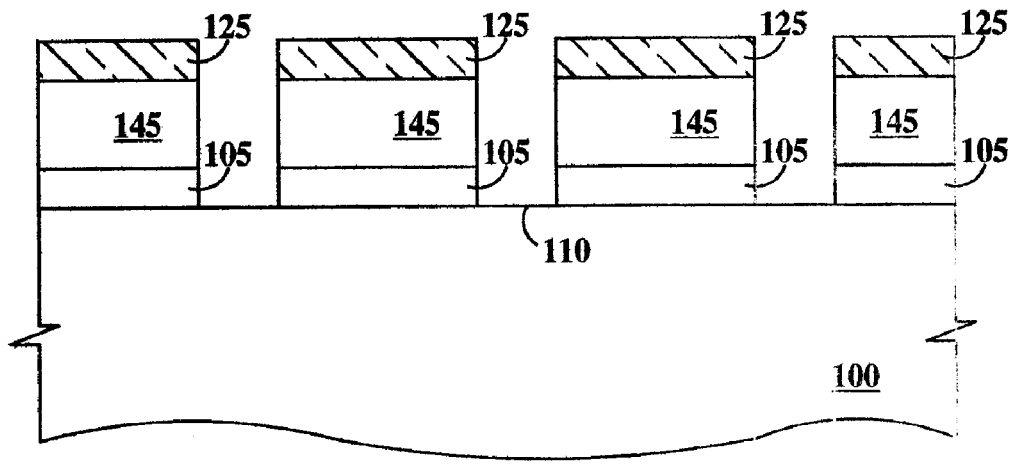
Figure 1I:
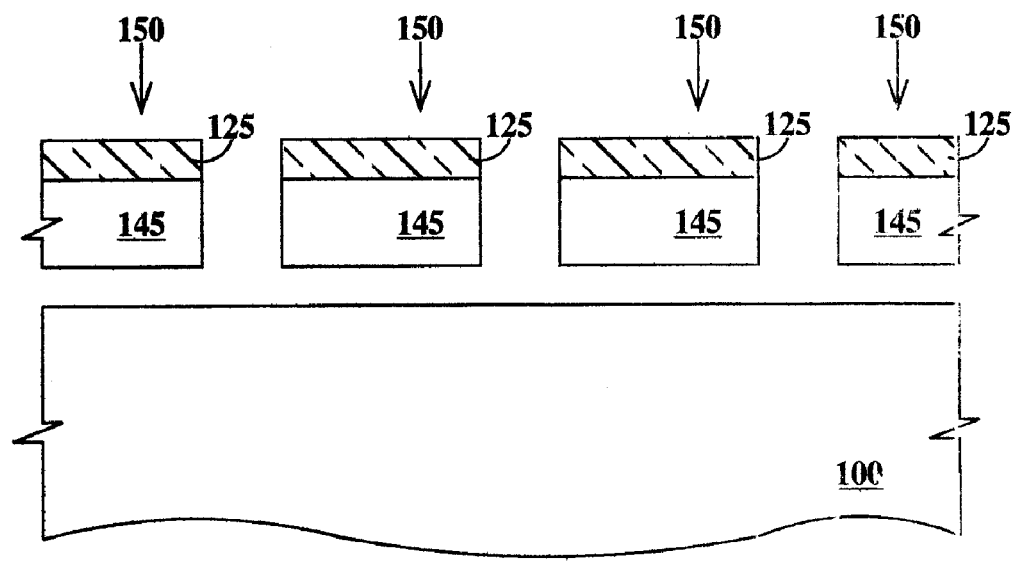

In FIG. 1H, photoresist islands 135 (see FIG. 1G) are removed. In FIG. 1I, SiGe layer 105 (see FIG. 1H) is removed, thus freeing individual micro-chips 150, each micro-chip including a silicon island 145 and a corresponding interconnection island 125. In one example, an isotropic etch process selective to SiGe relative to Si is used. One example of a selective SiGe to Si wet etch process includes etching the SiGe in a H$_2$O$_2$/HNO$_3$ mixture or an H$_2$O$_2$/NH$_3$OH mixture. One example of a selective SiGe to Si plasma process includes etching the SiGe using a CF$_4$. One method to increase plasma etch isotropicity is to increase the pressure of a plasma etch process.

Figure 2A:
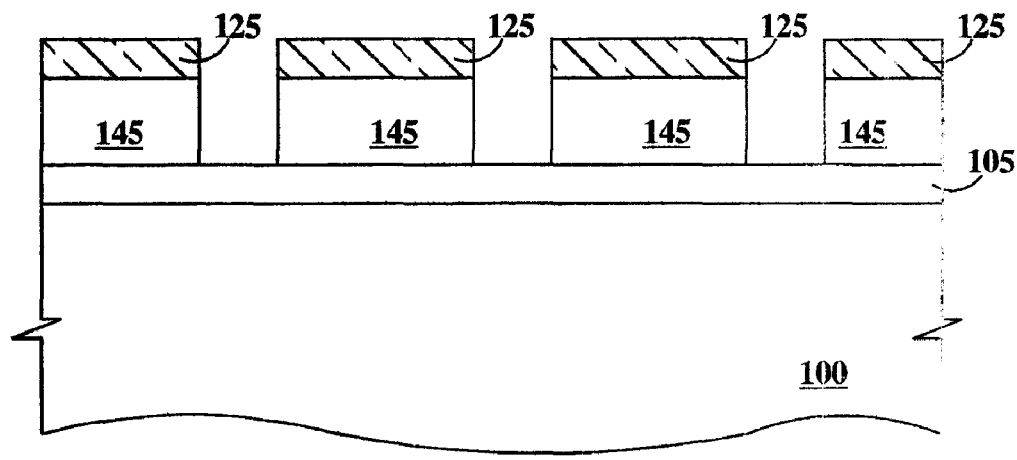
FIGS. 2A through 2D are partial cross sections illustrating fabrication of a micro-chip according to a second embodiment of the present invention.

FIGS. 2A through 2D are partial cross sections illustrating fabrication of a micro-chip according to a second embodiment of the present invention. In FIG. 2A, all the processes illustrated in FIGS. 1A through 1F and described supra have been performed and photoresist islands 135 (see FIG. 1F) removed. In FIG. 2A, at least a continuous portion layer of SiGe layer 105 is still in place.

Figure 2B:
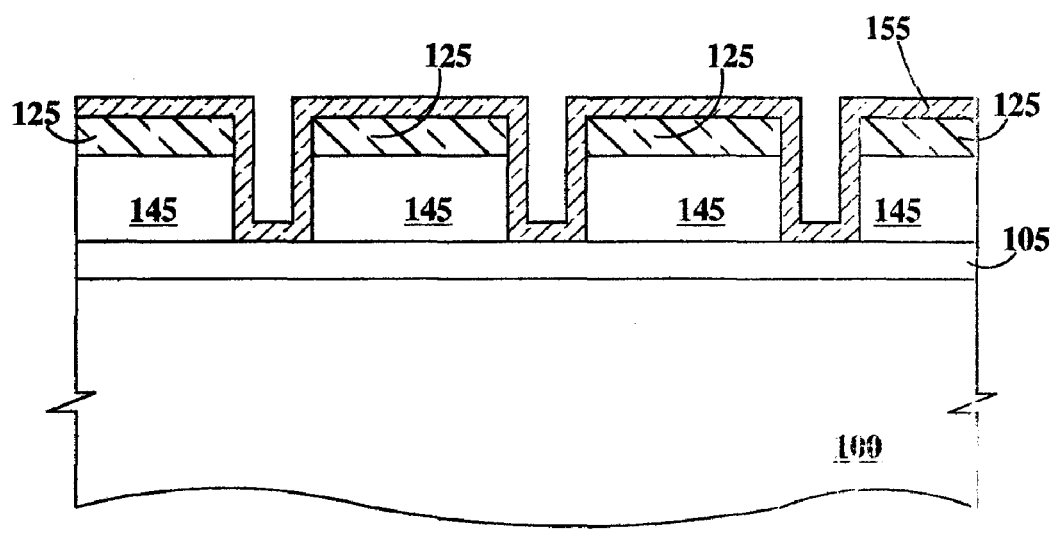

In FIG. 2B a conformal layer 155 is deposited on exposed surface of interconnection islands 125, silicon islands 145 and SiGe layer 105. In one example, conformal layer 155 is Si$_3$N$_4$ and is about 0.25 microns to about 20 microns thick.

Figure 2C:
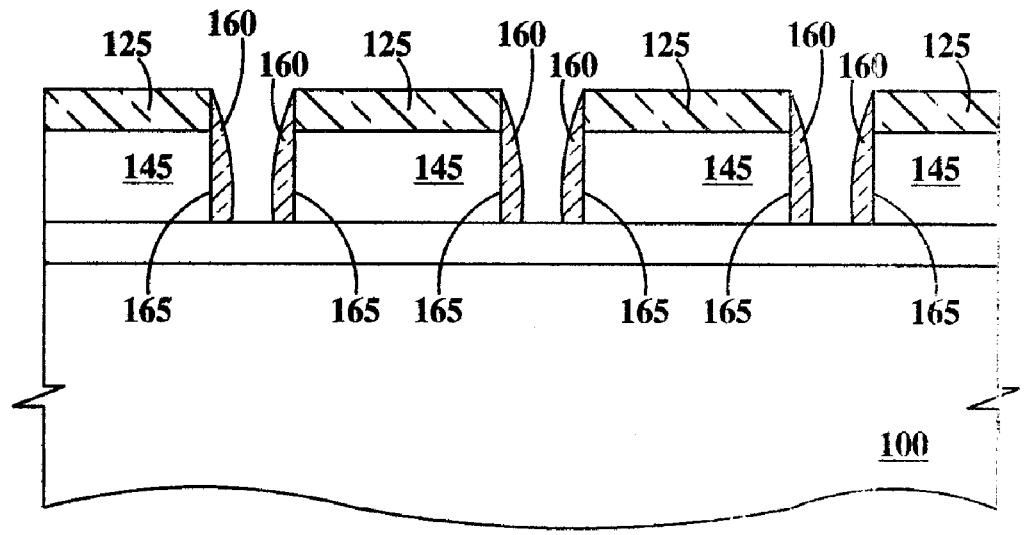
Figure 2D:
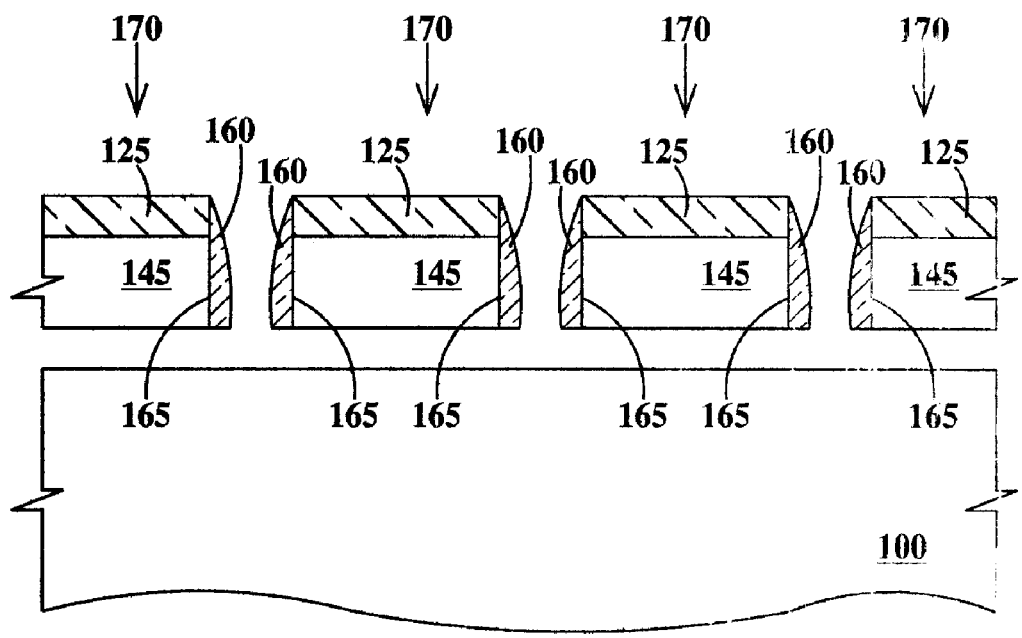

In FIG. 2C, a RIE process has been performed to form sidewall spacers 160 protecting exposed sidewalls 145 of silicon islands 145. In FIG. 2D, SiGe layer 105 (see FIG. 2C) is removed, using any of the processes describe supra in reference to FIG. 1I, thus freeing individual micro-chips 170, each micro-chip including a silicon island 145, a corresponding interconnection island 125 and a sidewall spacer 165.

The second embodiment of the present invention is useful when at least one horizontal dimension or vertical dimension (the vertical dimension is determined by the thickness of silicon layer 115, see FIG. 1C) is small enough to be significantly reduced by the SiGe etching. For example, given a 10 micron thick, 150 micron square microchip where the selectively of the SiGe etch process relative to Si was 100:1, the released micro-chip will be about 148.5 microns square and about 9.25 microns thick along its edges. The percentage of micro-chip shrinkage increases as the selectivity of SiGe to Si and as the thickness of and the horizontal dimensions of the micro-chip decreases.

FIG. 3 is a top view of a wafer illustrating an array of integrated circuits. In FIG. 3, a wafer 175 includes an array of micro-chips 150 or 170 separated by an area 180. One use for area 180 is to allow dicing of a wafer into individual chips. When a saw is used for dicing, the width the cut the saw makes may be referred to as a saw kerf. When the present invention is used for dicing, the width of the trench formed in the single0crystal silicon and single crystal SiGe layers may be referred to as etch kerf. That the present invention wastes less silicon wafer area (more chips can be produced per wafer) than fabrication techniques using, for example, a dicing saw to separate chips can be seen in Table 1.

TABLE I

| CHIP SIZE | SAW KERF | AREA OF CHIP AND SAW KERF | ETCH KERF | AREA OF CHIP AND ETCH KERF | INCREASE IN NUMBER OF CHIPS |
|---|---|---|---|---|---|
| 400 micron square | 150 micron | 0.3 square microns | 10 micron | 0.17 square. microns | 60% |
| 150 micron square | 150 microns | 0.09 square microns | 10 microns | 0.026 square microns | 250% |

It can be readily seen, that the present invention provides more chips per wafer than convention saw dicing. Further, with very small dimension chips, the wafer thickness can be greater than the chip dimensions. The present invention, allows control of the micro-chip thickness without added steps of etching the completed chips after dicing which is often not possible.

FIGS. 4 and 5 are a top views of two alternative footprints for an exemplary integrated circuit that may be fabricated according to the present invention. An example of an integrated circuit chip that may be fabricated using the present invention is radio frequency identification (RFID) micro-chip. The circuit of a typical RFID micro-chip is illustrated in FIG. 6 and described infra. Microchip 185A is square and includes a square antenna 190A. Microchip 185B is rectangular and includes a rectangular antenna 190B. where its length L is about 4× or more greater than its width W. In some applications, a long thin antenna is more useful, but the waster of space in mechanically dicing (i.e. sawing or laser etching) a wafer of high L/W aspect ratio is prohibitive. High L/W aspect ratio micro-chips fabricated according to the present invention are not as wasteful of wafer area.

FIG. 6 is a schematic circuit diagram of an exemplary integrated circuit that may be fabricated according to the present invention. In FIG. 6, RFID circuit 200 includes a power receiver 205 for receiving electromagnetic radiation through an antenna 210 and converting the received electromagnetic radiation to electrical power. Power receiver 205 in turn supplies power to a transceiver (or a transmitter only) 215, a micro-processor 220 and a memory 225. Micro-processor 220 is connected to memory 225 by a bus 230 and micro-processor 220 is connected to transceiver 215 by a bus 220. Transceiver 215 is also connected to antenna 210. In one mode, when power is generated by an external power source, transceiver 215 transmits a signal generated by processor 220. In another mode, when power is generated by an external source, memory 225 records information received from processor 220 via transceiver 215.

Figure 7:
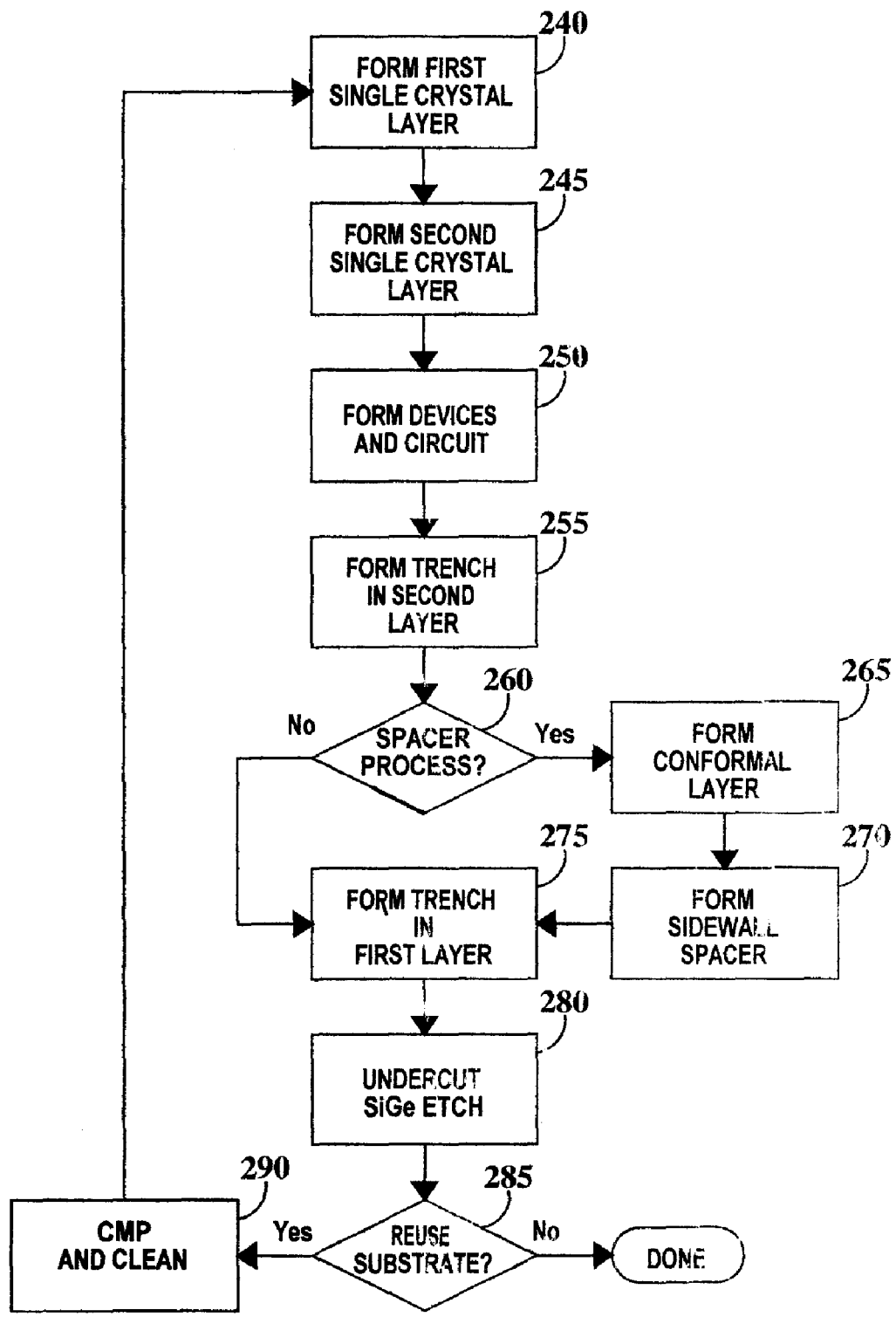
FIG. 7 is a flowchart of the steps of the method for fabrication of a micro-chip according to the present invention.

FIG. 7 is a flowchart of the steps of the method for fabrication of a micro-chip according to the present invention. In step 240, a single-crystal layer is formed on a top surface of a single-crystal substrate. The first single-crystal layer is a different material than that of the single-crystal substrate. In one example, the first single-crystal layer is SiGe and the single-crystal substrate is Si.

In step 250, a second single-crystal layer is grown on a top surface of the first single-crystal layer. In one example, the second single-crystal layer is Si and the single-crystal substrate is Si, each which may be independently doped n-type, p-type or undoped.

In step 250, devices such as NFETS, (PFETs), bipolar transistors, resistors and capacitors are formed in the second single-crystal layer and an interconnect wiring level(s) formed on a top surface of the second single-crystal layer.

In step 255, a series of intersecting trenches are formed in the second-single-crystal later to form of single-crystal islands and corresponding interconnect wiring level(s).

In step 260, the method branches depending upon whether a spacer process is to be performed. If in step 260, a spacer process is to be performed, then in step 265 a conformal layer is formed over exposed surfaces of the interconnect wiring level(s), the single-crystal islands and the first single-crystal layer. Then in step 270, the conformal layer is converted to a sidewall spacer protecting at least the sidewall of the single-crystal islands and exposing at least a portion of the first single-crystal layer between the single-crystal islands. The method then proceeds to step 275. If a spacer process was not selected in step 260, the method proceeds directly to step 275.

In step 275, a series of intersecting trenches is formed in the first single-crystal layer between the single-crystal islands. In step 280, the single-crystal islands are undercut by removal of the first-single-crystal layer to form micro-chips.

In step 285, it is determined if the single-crystal substrate is to be reused, then in step 290, a chemical-mechanical polish (CMP) is performed, a cleaning procedure performed, and the method loops back to step 240, otherwise the method is done.

Thus, the present invention provides a method of fabricating micro-chip integrated circuits that results in significantly reduced micro-chip thickness and waste of wafer area.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the present invention may be practiced using chips of any dimension and is useful for fabricating conventional sized integrated chips that are very thin without having to resort to backside grinding to reduce the thickness of the integrated circuit chip. The silicon layer may be replaced with other single-crystal layers such as other semiconductor materials and used in conjunction with the single-crystal $Si_xGe_y$, the single-crystal $Si_xC_y$, or single-crystal $Si_xAs_y$, layers described supra Therefore, it is intended that the following claims cover all such modifications and changes as fall within the true spirit and scope of the invention.

What is claimed is:

1. A method, comprising:
   (a) providing a substrate;
   (b) forming a first single-crystal layer on a top surface of said substrate;
   (c) forming a second single-crystal layer on a top surface of said first single-crystal layer;
   (d) forming one or more devices in said second single-crystal layer;
   (e) forming a trench in said second-single crystal layer, said trench surrounding said one or more devices, to form a single-crystal island containing said one or more devices in a region of said second single-crystal layer, said first single-crystal layer exposed in a bottom of said trench; and
   (f) removing said first single-crystal layer in order to separate said single-crystal island from said substrate.

2. The method of claim 1, wherein step (f) includes selectively removing said first single-crystal layer with respect to said second-single crystal layer.

3. The method of claim 1, wherein said substrate comprises silicon.

4. The method of claim 1, wherein said first single-crystal layer comprises $Si_xGe_y$, $Si_xC_y$ or $Si_xAs_y$.

5. The method of claim 1, wherein said second single-crystal layer comprises silicon.

6. The method of claim 1, further including:
   (g) after step (f) repeating steps (a) through (f) one or more times.

7. The method of claim 1, further including:
   (g) after step (f) mechanical-chemical-polishing said substrate to expose a new top surface of said substrate; and
   (h) after step (g) repeating steps (a) through (g) one or more times.

8. The method of claim 1, further including:
   between steps (e) and (f), forming a spacer on peripheral sidewalls of said single crystal island.

9. The method of claim 1, wherein said one or more devices are independently selected from the group consisting of NFETS, PFETs, bipolar transistors, resistors and capacitors.

10. The method of claim 1, wherein step (d) further includes interconnecting said one or more devices to form an integrated circuit in said second-single crystal layer.

11. The method of claim 10, wherein said integrated circuit is a radio frequency identification circuit.

12. The method of claim 1, wherein said trench comprises one or more intersecting trenches.

13. A method, comprising:
   (a) providing a single-crystal substrate;
   (b) forming a buried single-crystal layer in said substrate;
   (c) forming one or more devices in said a layer of said single-crystal substrate above said buried single-crystal layer;
   (d) forming a trench surrounding said one or more devices in a region of said layer of said single-crystal substrate above said buried single-crystal layer to form a single-crystal island containing said one or more devices, said buried single-crystal layer exposed in a bottom of said trench; and
   (e) removing said buried single-crystal layer in order to separate said single-crystal island from said substrate.

14. The method of claim 13, wherein step (b) includes performing an ion implantation of Ge or As or C followed by performing a heat treatment.

15. The method of claim 13, wherein said substrate comprises silicon.

16. The method of claim 13, wherein said first single-crystal layer comprises $Si_xGe_y$, $Si_xC_y$ or $Si_xAs_y$ and said second single-crystal layer comprises silicon.

17. The method of claim 13, wherein said one or more devices are independently selected from the group consisting of NFETS, PFETs, bipolar transistors, resistors and capacitors.

18. The method of claim 13, wherein step (d) further includes interconnecting said one or more devices to form an integrated circuit in said second-single crystal layer.

19. The method of claim 18, wherein said integrated circuit is a radio frequency identification circuit.

20. The method of claim 13, wherein said trench comprises one or more intersecting trenches.

21. A method, comprising:
   (a) providing a substrate;
   (b) forming a first single-crystal layer on a top surface of said substrate;
   (c) forming a second single-crystal layer on a top surface of said first single-crystal layer;
   (d) forming one or more devices in said second single-crystal layer;
   (e) forming a trench in said second-single crystal layer to form a single-crystal island containing said one or more devices, said first single-crystal layer exposed in a bottom of said trench; and
   (f) removing said first single-crystal layer in order to separate said single-crystal island from said substrate.

* * * * *